United States Patent
Sakai et al.

(10) Patent No.: US 6,639,311 B2
(45) Date of Patent: Oct. 28, 2003

(54) MULTILAYER CERAMIC ELECTRONIC COMPONENT, ELECTRONIC COMPONENT AGGREGATE, AND METHOD FOR PRODUCING MULTILAYER CERAMIC ELECTRONIC COMPONENT

(75) Inventors: Norio Sakai, Moriyama (JP); Isao Kato, Shiga-ken (JP); Mitsuyoshi Nishide, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/261,452

(22) Filed: Oct. 1, 2002

(65) Prior Publication Data

US 2003/0067068 A1 Apr. 10, 2003

(30) Foreign Application Priority Data

Oct. 5, 2001 (JP) .......................... 2001-310386
Aug. 26, 2002 (JP) .......................... 2002-244878

(51) Int. Cl.$^7$ ......................... H01L 23/12; H01L 23/053
(52) U.S. Cl. ..................... 257/700; 257/678; 257/703; 257/704; 257/705
(58) Field of Search ................ 257/700, 678, 257/704, 703, 705, 711, 713

(56) References Cited

U.S. PATENT DOCUMENTS

| 5,388,029 | A | * | 2/1995 | Moriyama | .............. | 361/760 |
|---|---|---|---|---|---|---|
| 5,847,930 | A | * | 12/1998 | Kazle | .............. | 361/736 |
| 5,864,092 | A | * | 1/1999 | Gore et al. | .............. | 174/52.4 |
| 5,953,213 | A | * | 9/1999 | Napierala | .............. | 361/760 |
| 6,528,875 | B1 | * | 3/2003 | Glenn et al. | .............. | 257/704 |
| 2003/0128526 | A1 | * | 7/2003 | Sakai et al. | .............. | 361/736 |

FOREIGN PATENT DOCUMENTS

| JP | 08-037251 | 2/1996 |
|---|---|---|
| JP | 09-116091 | 5/1997 |
| JP | 2000-031333 | 1/2000 |

\* cited by examiner

Primary Examiner—Jasmine Clark
(74) Attorney, Agent, or Firm—Keating & Bennett, LLP

(57) ABSTRACT

A multilayer ceramic electronic component includes an electronic component body a notch formed in a side surface of the electronic component body, and a joining electrode formed by dividing a joining via hole conductor is formed at a portion of an inside surface defining the notch. A cover that is mounted to the electronic component body has a leg, with the leg of the cover being positioned inside the notch. By joining the leg to the joining electrode, the cover is secured to the electronic component body. The multilayer ceramic electronic component includes an LGA (land grid array) type external terminal electrode. The multilayer ceramic electronic component makes it possible to mount a cover for covering a mounted component without increasing the planar dimensions of the electronic component and without decreasing an area for mounting a component to be mounted.

9 Claims, 9 Drawing Sheets

MULTILAYER CERAMIC ELECTRONIC COMPONENT, ELECTRONIC COMPONENT AGGREGATE, AND METHOD FOR PRODUCING MULTILAYER CERAMIC ELECTRONIC COMPONENT

BACKGROUND OF THE INVENTION

1. Field of the Invention

The present invention relates to a multilayer ceramic electronic component and a method for producing the same, and an electronic component aggregate which is produced during a process for producing the multilayer ceramic electronic component. More particularly, the present invention relates to an improvement in a structure for mounting a cover on the body of a multilayer ceramic electronic component including the cover.

2. Description of the Related Art

Various types of multilayer ceramic electronic components which are of interest with regard to the present invention are shown in FIGS. 14 and 15.

A multilayer ceramic electronic component 1 shown in FIG. 14 includes an electronic component body 2, with external terminal electrodes 3 being disposed at side surfaces of the electronic component body 2. The electronic component body 2 has a structure in which a plurality of ceramic layers are stacked. Although a conductive film and a via hole conductor are provided as internal circuit conductors inside the electronic component body 2, these are not shown in FIG. 14.

When the multilayer ceramic electronic component 1 is mounted onto a wiring substrate 4, the external terminal electrodes 3 are connected to connection lands 5, disposed on the wiring substrate 4, through solder 6. Here, since the external terminal electrodes 3 are disposed on side surfaces of the electronic component body 2, the solder 6 forms a solder fillet.

A multilayer ceramic electronic component 11 shown in FIG. 15 includes an electronic component body 12, with external terminal electrodes 14 being disposed on a downwardly facing major surface 13 of the electronic component body 12. The electronic component body 12 has a structure in which a plurality of ceramic layers 15 are stacked, and an internal circuit conductive film 16 and an internal circuit via hole conductor 17 are provided as internal circuit conductors inside the electronic component body 12.

The external terminal electrodes 14 are called LGA (land grid array) type electrodes. When an attempt is made to mount the multilayer ceramic electronic component 11 onto the wiring substrate 4, the external terminal electrodes 14 are arranged so as to oppose connection lands 5 on the wiring substrate 4, and the external terminal electrodes 14 and the connection lands 5 are connected together through solder 18. In soldering using the solder 18, ordinarily, cream solder is printed onto the connection lands 5, and, then, the multilayer ceramic electronic component 11 is placed onto the wiring substrate 4 in order to carry out reflow soldering using the cream solder. Unlike the multilayer ceramic electronic component 1 having the external terminal electrodes 3 disposed on side surfaces of the electronic component body 2 shown in FIG. 14, the multilayer ceramic electronic component 11 including the LGA-type external terminal electrodes 14 shown in FIG. 15 is such that the planar dimensions of the multilayer ceramic electronic component 11 itself becomes a planar dimensions that is required for mounting because the solder 18 does not form a solder fillet. Consequently, the planar dimensions required for mounting can be made small, so that higher density mounting can be achieved.

Electronic components which cannot be incorporated inside the electronic component body 2 of such a multilayer ceramic electronic component 1 or the electronic component body 12 of such a multilayer ceramic electronic component 11, such as inductors, capacitors, resistors, transistors, diodes, or integrated circuits, are sometimes mounted onto an upwardly facing major surface of the electronic component body 2 or the electronic component body 12. In FIG. 14, these components that are mounted are not shown. In FIG. 15, a number of components 20 that are mounted are shown on an upwardly facing major surface 19 of the electronic component body 12.

When such components 20 are mounted, for the purpose of, for example, causing the multilayer ceramic electronic component 1 or the multilayer ceramic electronic component 11 to be in a surface mountable state, a cover 7 (indicated by broken lines in FIG. 14) or a cover 21 (indicated by broken lines in FIG. 15) is joined to the electronic component body 2 or the electronic component body 12 corresponding thereto. The covers 7 and 21 are like receptacles, and are arranged so that their openings face their corresponding electronic component bodies 2 and 12.

In the case of the multilayer ceramic electronic component 1 shown in FIG. 14, when the cover 7 is made of metal, it can be secured to the electronic component body 2 by, for example, soldering and joining it to either one of the external terminal electrodes 3.

In contrast, in the multilayer ceramic electronic component 11 shown in FIG. 15, since the external terminal electrodes are not disposed on side surfaces of the electronic component body 12, the cover 21 cannot be easily mounted as the cover 7 can in the multilayer ceramic electronic component 1 described above.

For example, when an attempt is made to mount the cover 21 using the downwardly facing external terminal electrodes 14 mounted to the electronic component body 12, the planar configuration of the multilayer ceramic electronic component 11 becomes larger than the planar size of the electronic component body 12 by an amount corresponding to the thickness of the cover 21 and a joining portion to the external terminal electrodes 14, thereby preventing size reduction of the multilayer ceramic electronic component 11.

There is a method illustrated in FIG. 16. In this method, joining electrodes 22 are disposed on the upwardly facing major surface 19 of the electronic component body 12, end portions 23 defining the opening of the cover 21 are bent inward so as to oppose the joining electrodes 22, and the end portions 23 are soldered to the joining electrodes 22 using solder 24.

However, when such a method described above is used, since the area for mounting the components 20 onto the major surface 19 of the electronic component body 12 becomes small, in order to cause this mounting area to be equal to or greater than a certain area, the multilayer ceramic electronic component 11 must be made rather large.

When the cover 21 is made of metal, the area of the bent end portions 23 cannot be made so small due to processing problems. In addition, in order to provide the required adhesive strength between the joining electrodes 22 and the end portions 23, the areas of the joining electrodes 22 and the areas of the end portions 23 cannot be made so small. Therefore, regardless of the planar size of the electronic component body 12, the areas of the joining electrodes 22 and the areas of the end portions 23 need to be equal to or greater than certain areas. The smaller the planar configuration of the electronic component body 22, the more noticeable the problem concerning restrictions on the area for mounting the aforementioned components 20 becomes.

On the other hand, an electrode shown in FIG. 17 has been proposed as an electrode disposed on a side surface of an electronic component body of a multilayer ceramic electronic component. FIG. 17 is a perspective view showing in enlarged form a portion of an electronic component body 26 of a multilayer ceramic electronic component 25. A notch 28 which vertically passes through the electronic component body 26 is disposed in a side surface 27 of the electronic component body 26. An electrode 29 is arranged so as to cover the inside surface defining the notch 28.

The aforementioned electrode 29 may, for example, be formed by a method such as the following.

Basically, in this method, after forming an electronic component aggregate from which a plurality of the electronic component bodies 26 are obtained, the electronic component aggregate is divided along predetermined division lines in order to obtain the electronic component bodies 26.

More specifically, an electronic component aggregate having a structure in which a plurality of ceramic layers are stacked is formed. Either before or after baking, through holes, which become notches 28, are formed in the electronic component aggregate. Conductors, which become electrodes 29, are provided at the inside surfaces defining the corresponding through holes. Typically, electrically conductive paste is used as the conductors. When the electrically conductive paste is applied, the electrically conductive paste is usually applied to both peripheral portions of the openings of the through holes.

Next, after baking, the electronic component aggregate is divided along division lines that pass through the through holes. Surfaces which are formed as a result of this dividing operation become side surfaces 27. The through holes are divided and become the notches 28. The conductors applied to the inside surfaces defining the through holes are divided and become the electrodes 29.

However, the above-described method has the following problems.

When the electronic component aggregate is divided, what is called chocolate breaking is usually performed. During the dividing operation, the conductors may not be properly divided. As a result, a portion of the electrode 29 inside the notch 28 of one divided electronic component body 26 may be "forcefully transferred" to the electrode 29 inside the notch 28 of another electronic component body 26. In extreme cases, an electrode 29 may not be formed inside the notch 28 of the one electronic component body 26.

In order to overcome this problem, it is necessary to apply the conductors to the inside surfaces defining their corresponding through holes as thinly and uniformly as possible. However, it is relatively difficult to uniformly and thinly apply the conductors.

Another method is carried out instead of the above-described method. In this method, before placing upon each other a plurality of ceramic green sheets forming a raw electronic component aggregate, through holes are formed in the ceramic green sheets and conductors are applied to the inside surfaces defining the through holes. In this case, after forming the through holes and applying the conductors to the inside surfaces defining the through holes, the plurality of ceramic green sheets are stacked and pressed in a stacking direction. By this process, a raw electronic component aggregate is produced, and is baked.

However, even when this method is used, since a plurality of electronic component bodies 26 are obtained by dividing the electronic component aggregate, the same problems as those of the above-described method are encountered. In addition, since the ceramic green sheets having through holes are stacked and pressed, other problems may be encountered. For example, the holes formed in each of the ceramic green sheets may become undesirably deformed due the heat and pressure applied in the pressing step, or positional displacements of through holes with respect to each other may occur in the stacking step.

SUMMARY OF THE INVENTION

In order to overcome the problems described above, preferred embodiments of the present invention provide a greatly improved multilayer ceramic electronic component including a cover and a method for producing the same.

In addition, preferred embodiments of the present invention provide an electronic component aggregate which is obtained during a process for obtaining the above-described novel multilayer ceramic electronic component.

In order to overcome the above-described problems, a multilayer ceramic electronic component according to preferred embodiments of the present invention has the following structures.

According to a first preferred embodiment of the present invention, a multilayer ceramic electronic component includes an electronic component body having a structure in which a plurality of ceramic layers are stacked on each other. The electronic component body includes opposing first and second major surfaces and a side surface which connects the first and second major surfaces. In the multilayer ceramic electronic component, a notch which extends from the first major surface to the second major surface is formed in the side surface of the electronic component body, and a joining electrode that is formed by dividing a joining via hole conductor is provided at a portion of an inside surface defining the notch. In addition, a component is mounted on the first major surface of the electronic component body. Further, a receptacle-like cover is disposed so as to cover the component with an opening of the cover facing the electronic component body. The cover has a leg which is positioned inside the notch, and is secured to the electronic component body by joining the leg to the joining electrode. Still further, an external terminal electrode for connecting the multilayer ceramic electronic component to a wiring substrate is disposed on the second major surface of the electronic component body.

In one example of the above-described preferred embodiment, the cover is preferably made of metal, and the leg of the cover and the joining electrode are joined with solder or an electrically conductive adhesive.

In another example of the above-described preferred embodiment, the joining electrode is electrically connected to a ground electrode positioned inside the electronic component body.

According to another preferred embodiment of the present invention, an electronic component aggregate which is produced during a process for producing a plurality of the multilayer ceramic electronic components is provided. The electronic component aggregate has a structure including a plurality of ceramic layers which are stacked on each other. The electronic component aggregate includes opposing first and second major surfaces. The electronic component aggregate is such that a plurality of the electronic component bodies of the plurality of any one of the above-described multilayer ceramic electronic components can be obtained from the electronic component aggregate by dividing the electronic component aggregate in a direction that is substantially perpendicular to the major surfaces along a predetermined division line. A plurality of the joining via hole conductors are arranged so as to be located on both sides of the division line. Through holes passing through the first and second major surfaces are arranged so as to divide the joining via hole conductors. A plurality of the joining electrodes are defined by portions of the joining via hole conductors divided by the through holes.

According to a further preferred embodiment of the present invention, a method for producing any one of the above-described multilayer ceramic electronic components includes the steps of forming a raw electronic component aggregate having a structure including a plurality of ceramic green sheets which are stacked on each other, the raw electronic component aggregate having a plurality of the joining via hole conductors which become a plurality of the joining electrodes provided thereat, exposing the joining via hole conductors at portions of inside surfaces defining corresponding through holes by forming the through holes at locations of the raw electronic component aggregate that divide the joining via hole conductors, the through holes passing through opposing first and second major surfaces of the raw electronic component aggregate, baking the raw electronic component aggregate, dividing the electronic component aggregate along a division line passing through the through holes in order to provide a plurality of the electronic component bodies having the joining electrodes, formed by dividing the corresponding joining via hole conductors, formed on portions of a plurality of the inside surfaces of a plurality of the notches formed by dividing the through holes, mounting a plurality of the components onto a plurality of the first major surfaces of the electronic component bodies, securing a plurality of the covers to the corresponding electronic component bodies by disposing the covers so as to cover the corresponding components with a plurality of the openings of the covers facing the corresponding electronic component bodies, by positioning a plurality of the legs inside the corresponding notches, and by joining the legs to the corresponding joining electrodes, and forming a plurality of the external terminal electrodes onto a major surface of the ceramic green sheet defining the second major surface of the electronic component aggregate or the second major surface of the electronic component aggregate.

In an example of the above-described preferred embodiment, the step of forming a raw electronic component aggregate preferably includes the steps of providing a plurality of the ceramic green sheets, forming a clearance hole for positioning the joining via hole conductor at a particular one of the ceramic green sheets, forming the joining via hole conductor inside the clearance hole, forming an internal circuit conductor film on a particular one of the ceramic green sheets, and stacking the plurality of ceramic green sheets on each other.

In another example of the above-described preferred embodiment, in the step of forming the joining via hole conductor inside the clearance hole, the joining via hole conductor is formed so as to fill the clearance hole.

In a further example of the above-described preferred embodiment, in the step of forming a clearance hole for positioning the joining via hole conductor, a clearance hole for positioning an internal circuit via hole conductor is formed at the same time.

In yet another example of the above-described preferred embodiment, in the step of mounting a plurality of the components, the plurality of the components are mounted to the electronic component bodies which are components of the electronic component aggregate.

In a further example of the above-described preferred embodiment, in the step of securing a plurality of the covers to the corresponding electronic component bodies, the covers are secured to the corresponding electronic component bodies after dividing the electronic component aggregate.

Other features, elements, steps, characteristics and advantages of the present invention will be described with respect to preferred embodiments thereof with reference to the attached drawings.

DETAILED DESCRIPTION OF PREFERRED EMBODIMENTS

Figure 6:
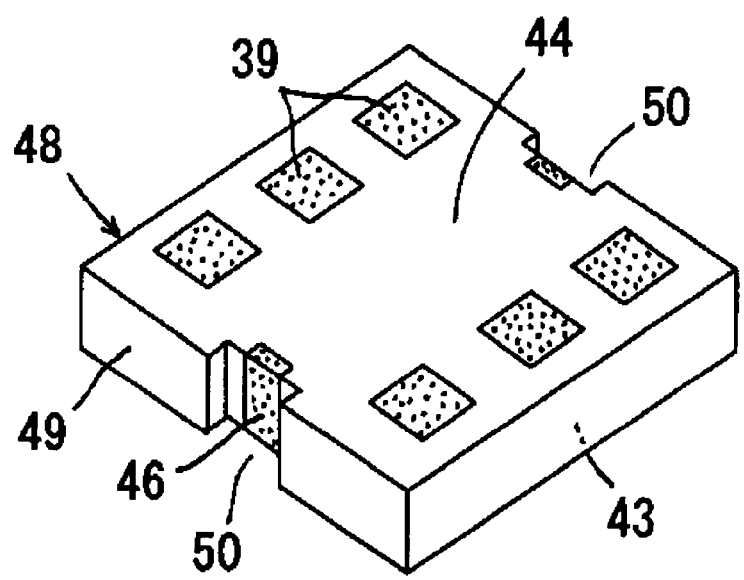
FIG. 6 is a perspective view showing an electronic component body, obtained by dividing the electronic component aggregate shown in FIG. 4, from a side of a second major plane.
Figure 7:
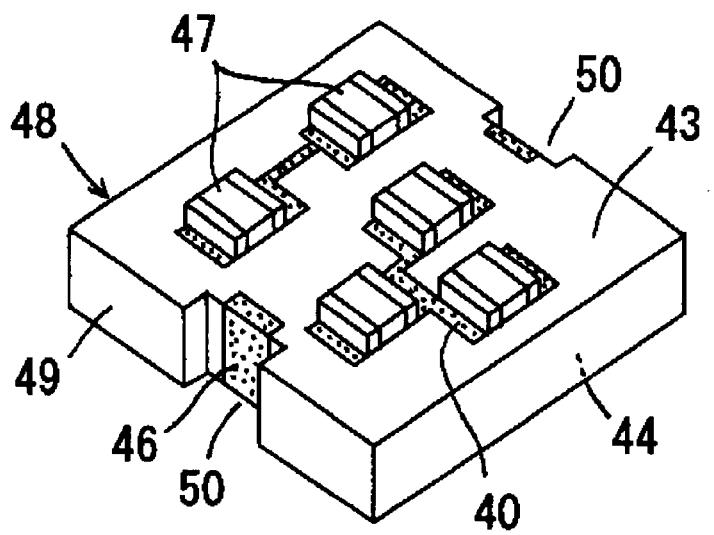
FIG. 7 is a perspective view showing the electronic component body shown in FIG. 6 from a side of a first major surface.
Figure 8:
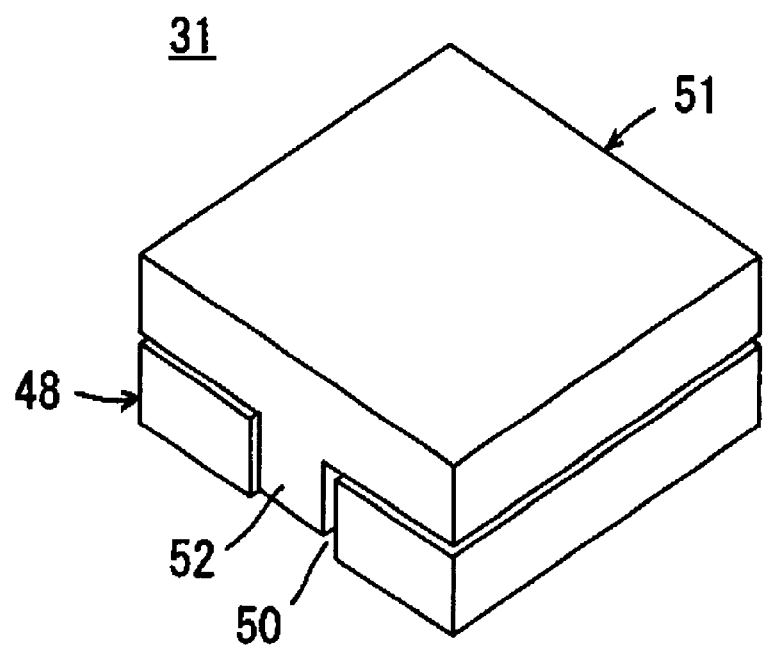
FIG. 8 is a perspective view of a multilayer ceramic electronic component produced by mounting a cover to the electronic component body shown in FIGS. 6 and 7.
Figure 9:
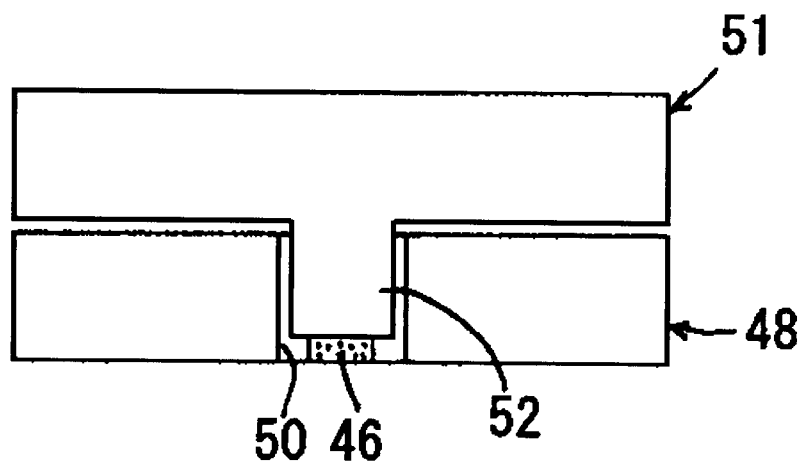
FIG. 9 is a front view of the multilayer ceramic electronic component shown in FIG. 8.

FIGS. 1 to 9 illustrate preferred embodiments of the present invention. FIGS. 8 and 9 show a multilayer ceramic electronic component 31. In order to produce the multilayer ceramic electronic component 31, the steps which are described with reference to FIGS. 1 to 7 are carried out successively. Hereunder, a description of a method for producing the multilayer ceramic electronic component 31 will be provided.

Figure 1:
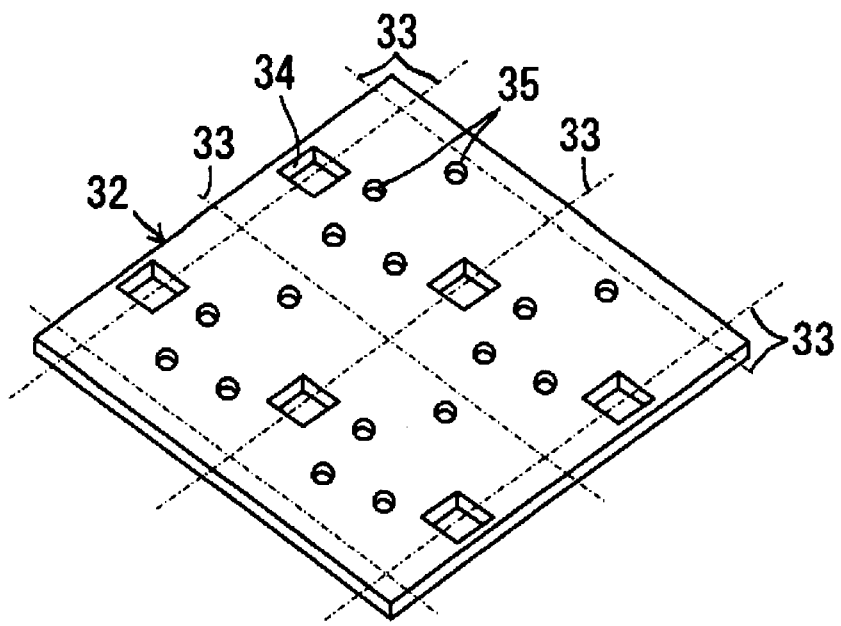
FIG. 1 is a perspective view showing a ceramic green sheet which is provided for producing a multilayer ceramic electronic component according to a preferred embodiment of the present invention.
Figure 2:
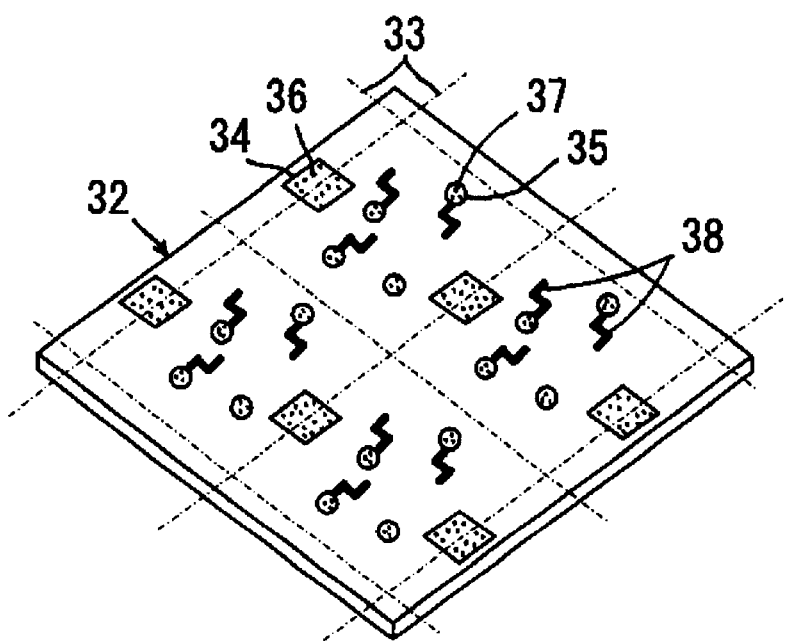
FIG. 2 is a perspective view showing a state in which joining via hole conductors are formed on the ceramic green sheet shown in FIG. 1.
Figure 3:
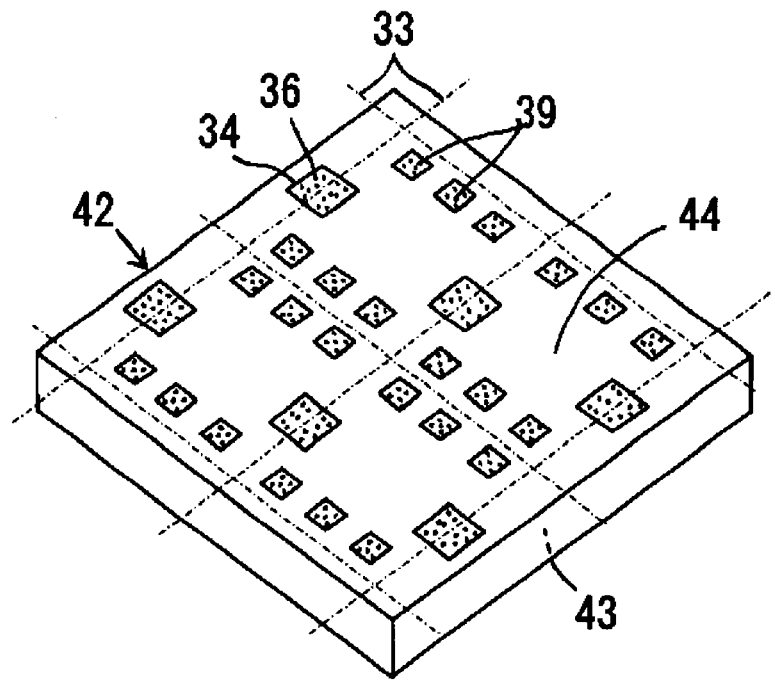
FIG. 3 is a perspective view showing a raw electronic component aggregate produced by stacking a plurality of the ceramic green sheets shown in FIG. 2 on each other.
Figure 4:
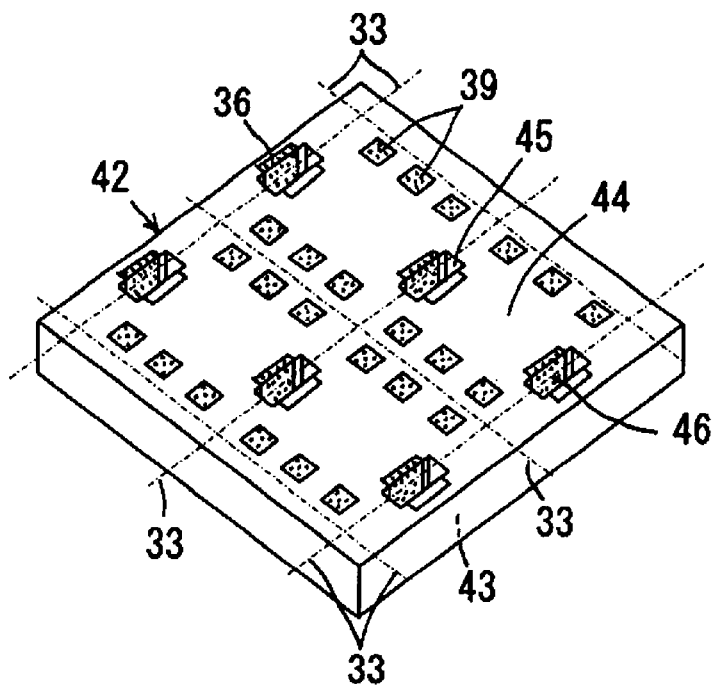
FIG. 4 is a perspective view showing a state in which through holes are formed in the raw electronic component aggregate shown in FIG. 3.

First, a plurality of ceramic green sheets 32 are provided (one ceramic green sheet 32 is shown in FIG. 1). In FIGS. 2 to 4 (referred to later) as well as in FIG. 1, the locations of division lines 33 along which a dividing operation is carried out in a later step of dividing an electronic component aggregate are indicated by alternate long and short dash lines.

Clearance holes 34 for positioning joining via hole conductors (described later) are provided on the division lines 33 in the ceramic green sheets 32. In addition, clearance holes 35 for positioning internal circuit via hole conductors are formed in the ceramic green sheets 32.

Next, as shown in FIG. 2, by filling the clearance holes 34 and 35 with, for example, electrically conductive paste, joining via hole conductors 36 are formed inside the clearance holes 34, and internal circuit via hole conductors 37 are formed inside the clearance holes 35.

Figure 5:
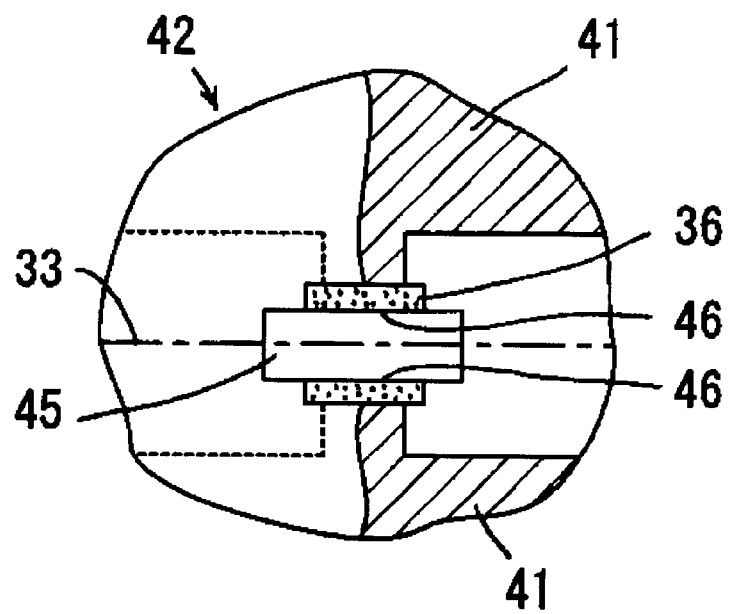
FIG. 5 is a plan view showing in enlarged form one portion of the raw electronic component shown in FIG. 4.

For example, an electrically conductive paste forms internal circuit conductive films 38 on the ceramic green sheets 32. In this step, external terminal electrodes 39 (described later) shown in FIG. 3 and connection lands 40 shown in FIG. 7 are formed by electrically conductive paste. FIG. 5 shows a portion of a ground electrode 41 as an example of an internal circuit conductive film 38. The ground electrodes 41 are also formed in a step of forming the internal circuit conductive films 38. The ground electrodes 41 are connected to the joining via hole conductors 36.

Examples of conductive components contained in the electrically conductive paste for forming the aforementioned joining via hole conductors 36, internal circuit via hole conductors 37, internal circuit conductive films 38, external terminal electrodes 39, connection lands 40, and ground electrodes 41 preferably include, for example, Ag, Ag/Pd, Ag/Pt, or Cu or CuO as a primary component.

Stacking the plurality of ceramic green sheets 32 upon each other and pressing them in a stacking direction provide a raw electronic component aggregate 42 shown in FIG. 3. The raw electronic component aggregate 42 has opposing first and second major surfaces 43 and 44. FIG. 3 shows the raw electronic component aggregate 42 from the side of the second major surface 44 where the external terminal electrodes 39 are formed. Although not shown in FIG. 3, the connection lands 40 shown in FIG. 7 are formed on the first major surface 43.

In the illustrated preferred embodiment, the joining via hole conductors 36 are preferably formed at all of the ceramic green sheets 32 of the raw electronic component aggregate 42, with these joining via hole conductors 36 being formed in a row in the thickness direction of the raw electronic component aggregate 42 and penetrating it from the first major surface 43 to the second major surface 44.

Unlike the joining via hole conductors 36 of the illustrated preferred embodiment, joining via hole conductors 36 may be formed at only some of the ceramic sheets 32 of the raw electronic component aggregate 42 in the thickness direction thereof.

The forms of the internal circuit via hole conductors 37 and the internal circuit conductive films 38 shown in FIG. 2 are merely examples. Accordingly, the internal circuit via hole conductors 37 and the internal circuit conductive films 38 are usually formed with different forms with each ceramic green sheet 32, or ceramic green sheets 32 having neither internal circuit via hole conductors 37 nor internal circuit conductive films 38 are sometimes stacked in the raw electronic component aggregate 42.

Next, as shown in FIG. 4, through holes 45 which pass through the first and second major surfaces 43 and 44 are formed on the division lines 33 and at locations that divide the joining via hole conductors 36. The forms of the through holes 45 are shown in the enlarged plan view of FIG. 5. By forming the through holes 45, the joining via hole conductors 36 are exposed at portions of the inside surfaces defining the corresponding through holes 45. By the exposed portions of the joining via hole conductors 36, joining electrodes 46 are provided.

Next, the raw electronic component aggregate 42 is baked.

After the baking, as required, the external terminal electrodes 39, the connection lands 40, and the joining electrodes 46 are plated with, for example, Ni/Sn, Ni/Au, or Ni/solder, or other suitable material.

After the plating, although not illustrated in FIG. 4, as shown in FIG. 7, several components 47 to be mounted are mounted to the first major surface 43 of the electronic component aggregate 42. These components 47 are soldered to the connection lands 40.

After the soldering, the electronic component aggregate 42 is divided along the division lines 33 passing through the through holes 45. As a result, a plurality of electronic component bodies 48 shown in FIGS. 6 and 7 are obtained. During the dividing operation, what is called chocolate breaking is performed. In order to make it possible to easily proceed with this chocolate breaking operation, it is desirable to form grooves (not shown) along the division lines 33 in the first major surface 43 and/or the second major surface 44 of the electronic component aggregate 42.

FIG. 6 shows the electronic component body 48 from the side of the second major surface 44, and FIG. 7 shows it from the side of the first major surface 43. Notches 50 formed by dividing the through holes 45 are formed in side surfaces 49 of the electronic component body 48 so as to extend from the first major surface 43 to the second major surface 44. Each joining electrode 46 obtained by dividing the corresponding joining via hole conductor 36 is formed in one portion of the inside surface defining the corresponding notch 50.

As shown in FIGS. 8 and 9, a cover 51 is mounted so as to cover the components 47. The cover 51 is like a receptacle and is arranged so that its opening faces the first major surface 43 of the electronic component body 48.

The cover 51 has legs 52, which are positioned inside their corresponding notches 50. In this state, when the cover 51 is made of metal, the cover 51 is secured to the electronic component body 48 by joining the legs 52 to the joining electrodes 46 using solder or electrically conductive adhesive (not shown).

When the multilayer ceramic electronic component 31 is used for high-frequency purposes, in order to prevent noise interference or high-frequency signal emission with respect to other electronic components and in order to make it easier to process the cover 51 at low cost, it is desirable to use metals such as phosphor bronze, 42 alloy (42 Ni/Fe), 50 alloy (50 Ni/Fe) as a material of the cover 51.

When solder is used to join the legs 52 and the joining electrodes 46, it is desirable to previously plate the cover 51 with, for example, solder or tin.

In this way, the multilayer ceramic electronic component 31 is completed.

Although the present invention has been described with reference to the illustrated preferred embodiment, various modifications may be made within the scope of the present invention.

For example, although in the above-described preferred embodiment, the external terminal electrodes 39 and the connection lands 40, which are formed at the external surfaces of the electronic component aggregate 42, are formed on the ceramic green sheets 32, they may be formed on the external surfaces of the electronic component aggregate 42 prior to or after baking.

Although, in the above-described preferred embodiment, the components 47 are mounted to the electronic component aggregate 42, they may be mounted after dividing the electronic component aggregate 42 into individual electronic component bodies 48.

Although, in the above-described preferred embodiment, the cover 51 is mounted to an electronic component body 48 after dividing the electronic component aggregate 42, the cover 51 may be mounted to the electronic component aggregate 42 before it is divided.

The numbers, positions, etc., of the joining electrodes 46, formed at the side surfaces 49 of an electronic component body 48, and the legs 52 of the cover 51 may be arbitrarily changed.

Although, in the above-described preferred embodiment, the joining via hole conductors 36 and the through holes 45 preferably have substantially rectangular cross-sectional shapes, these shapes may be arbitrarily changed.

Figure 10:
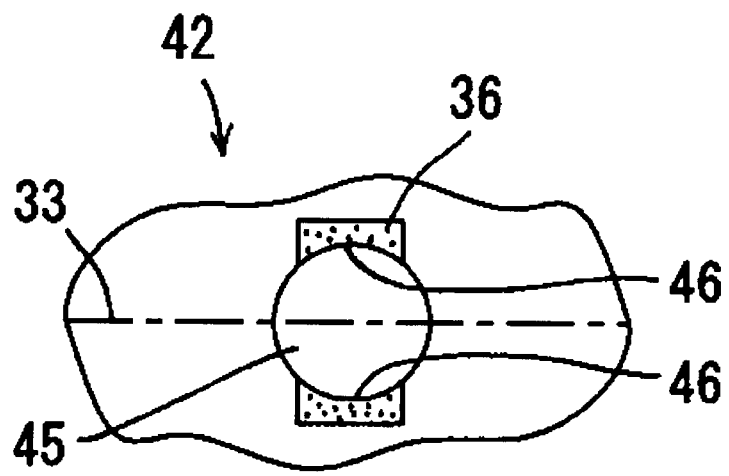
FIG. 10 is used to illustrate another preferred embodiment of the present invention and is a plan view showing a portion of the electronic component aggregate where a joining via hole conductor and a through hole are formed.
Figure 11:
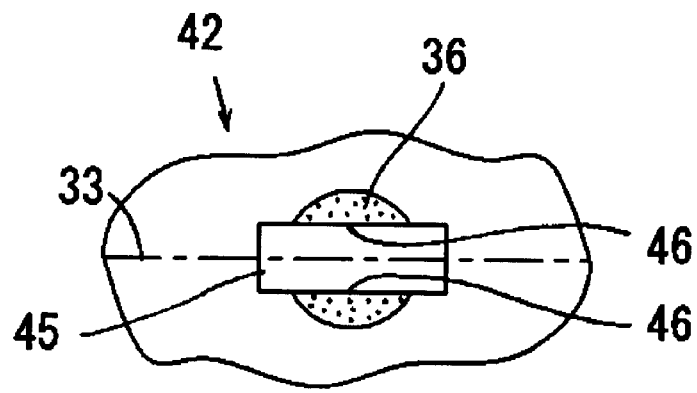
FIG. 11 is used to illustrate still another preferred embodiment of the present invention, and is a plan view of the portion corresponding to that shown in FIG. 10.

For example, as shown in FIG. 10, a substantially circular cross-sectional through hole 45 may be provided so as to divide its corresponding joining via hole conductor 36 having a substantially rectangular cross-sectional shape. Alternatively, as shown in FIG. 11, a substantially rectangular cross-sectional through hole 45 may be provided so as to divide a joining via hole conductor 36 having a substantially circular cross-sectional shape.

Figure 12:
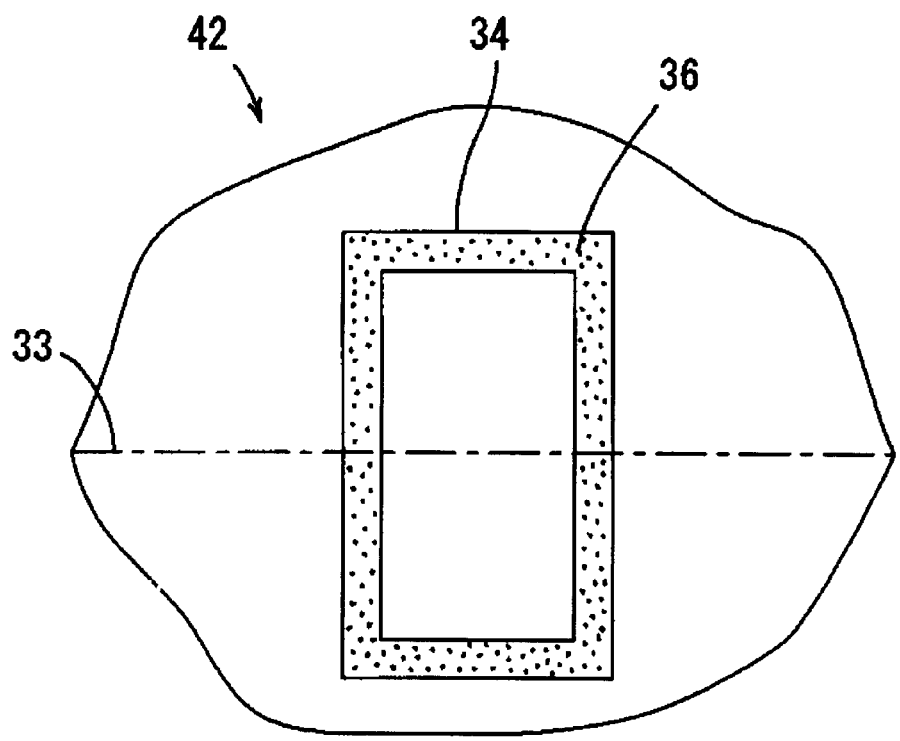
FIG. 12 is used to illustrate still another preferred embodiment of the present invention, and is a plan view showing a portion of the raw electronic component aggregate at a stage corresponding to that shown in FIG. 3.
Figure 13:
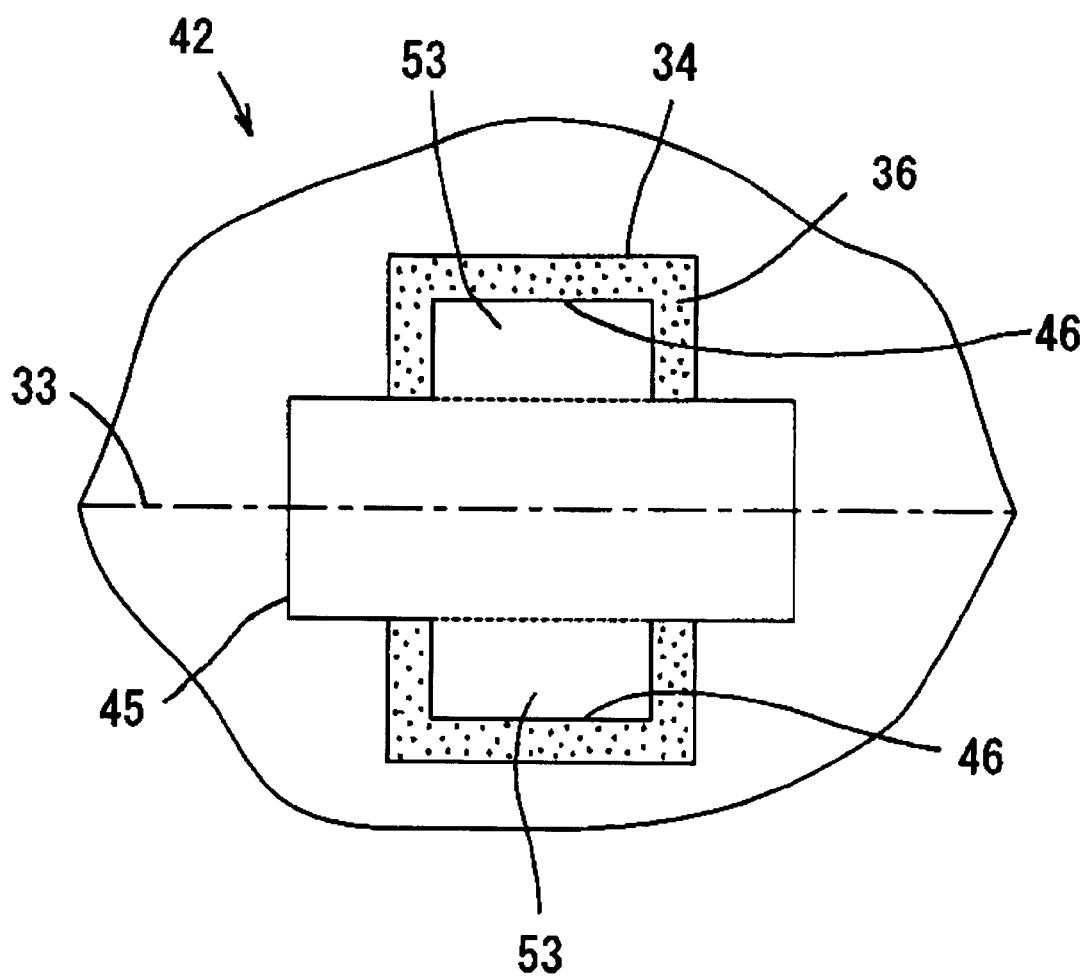
FIG. 13 is a plan view showing a state in which a through hole is formed in the raw electronic component aggregate shown in FIG. 12.
Figure 14:
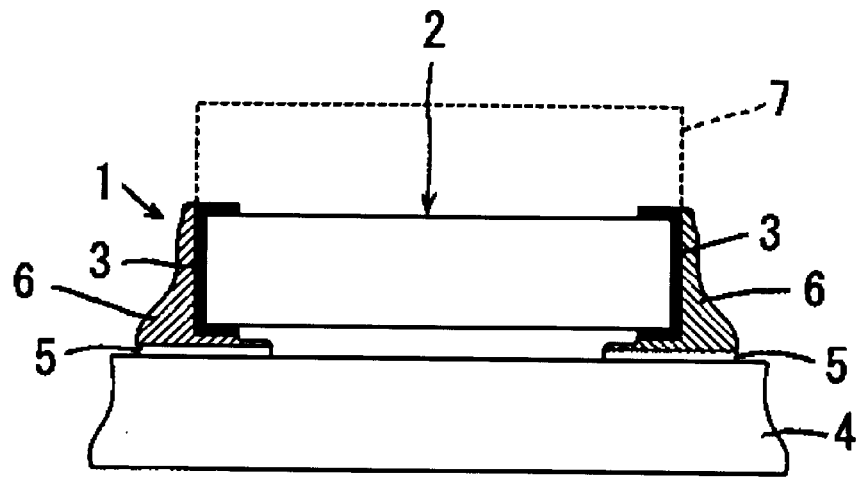
FIG. 14 is a front view showing a state in which a related multilayer ceramic electronic component which is of interest with regard to preferred embodiments of the present invention is mounted.
Figure 15:
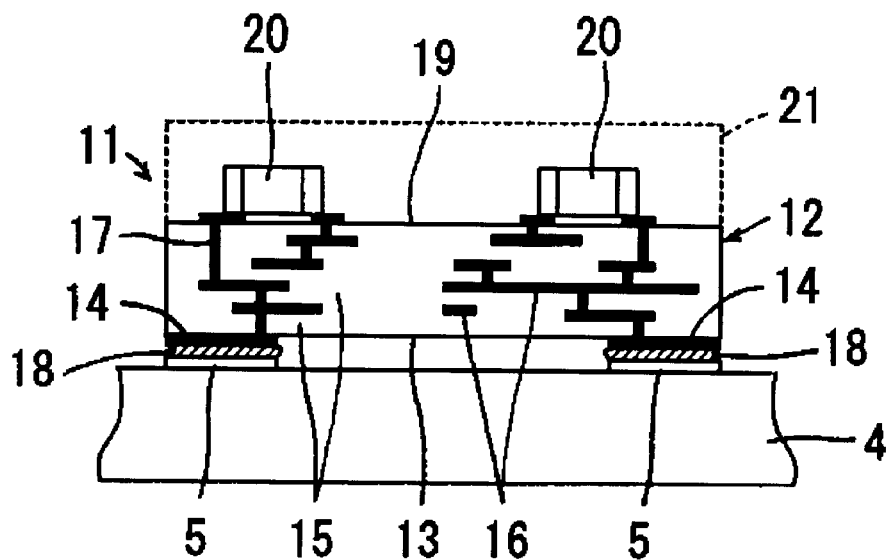
FIG. 15 is a front view showing a state in which another related multilayer ceramic electronic component which is of interest with regard to the present invention is mounted.
Figure 16:
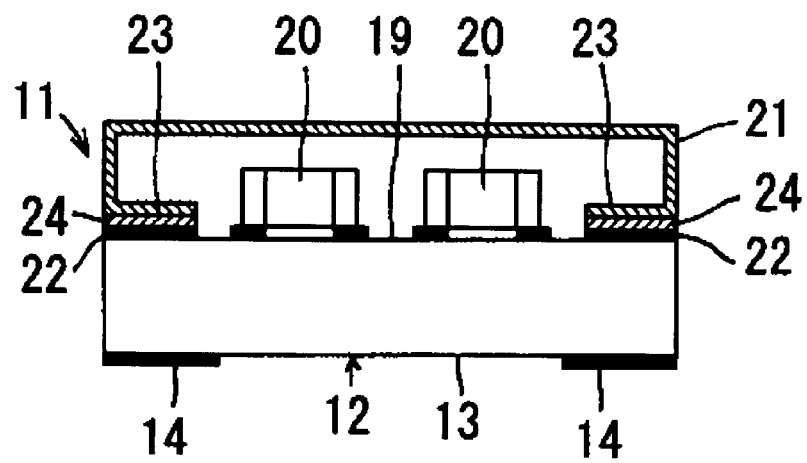
FIG. 16 is a schematic sectional view for illustrating a state in which a cover is mounted in the multilayer ceramic electronic component shown in FIG. 15.
Figure 17:
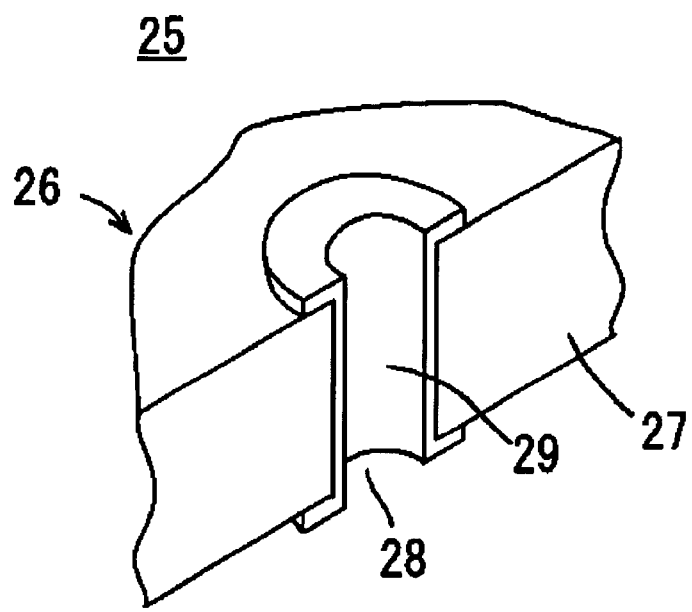
FIG. 17 is a perspective view for illustrating a related technology which is of interest with regard to the present invention, and is a perspective view showing a portion of a multilayer ceramic electronic component where an electrode is formed.

Although, in the above-described preferred embodiment, the joining via hole conductors 36 are formed so as to fill the clearance holes 34, as shown in FIG. 12, the joining via hole conductors 36 may be formed at only the inner peripheral surfaces defining their corresponding clearance holes 34 by applying electrically conductive paste to the inner peripheral surfaces defining the clearance holes 34 without filling the clearance holes 34 with them. In this case, as shown FIG. 13, when the through holes 45 are formed on the division lines 33, recesses 53, which are defined by the joining via hole conductors 36, extend so as to be connected to sides of the through holes 45. In addition, each joining via hole conductor 36 is exposed at a portion of the inside surface defining its corresponding through hole 45 and at its aforementioned corresponding recess 53.

As described above, according to preferred embodiments of the present invention, through holes which divide the joining via hole conductors are provided, so that, as a result, notches are formed in side surfaces of an electronic component body and joining electrodes are formed at portions of the inside surfaces defining the notches. Therefore, it is possible to secure the cover to the electronic component body by, while disposing the receptacle-like cover so that its opening faces the electronic component body, positioning the legs of the cover inside their corresponding notches, and joining them to their corresponding joining electrodes.

Consequently, even if the external terminal electrodes are provided on the major surface of the electronic component body opposite to the side where the cover is disposed, it is possible to mount the cover without increasing the planar dimensions of the multilayer ceramic electronic component. In addition, it is possible to mount the cover without decreasing the area for mounting the components to be mounted onto the electronic component body.

According to the method of producing a multilayer ceramic electronic component according to preferred embodiments of the present invention, through holes are provided so as to divide the joining via hole conductors while adopting the step of obtaining a plurality of electronic component bodies by dividing the electronic component aggregate, and the electronic component aggregate is divided along the division lines passing through the corresponding through holes. Therefore, it is possible to always form joining electrodes in a proper state without the joining via hole conductors being improperly divided or separated in the dividing operation.

Since the joining electrodes formed by dividing the joining via hole conductors are embedded in the inside surfaces defining their corresponding notches as described above, their strengths against separation are high, so that the cover can be secured to the electronic component body in a more reliable state.

In the multilayer ceramic electronic component of preferred embodiments of the present invention, since, when the cover is made of metal, the legs and the joining electrodes are joined together, it is possible to use solder or electrically conductive adhesive.

In the aforementioned case, in the case where the joining electrodes are electrically connected to the ground electrodes located inside the electronic component body, when the multilayer ceramic electronic component is mounted on the wiring substrate, such ground electrodes are electrically connected to ground potentials at the wiring substrate side. Therefore, the cover is also electrically connected to the ground potentials at the wiring substrate side through the joining electrodes. Therefore, it is possible to increase grounding of the entire multilayer ceramic electronic component and to increase high-frequency properties of the multilayer ceramic electronic component.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A multilayer ceramic electronic component comprising:
an electronic component body including a plurality of ceramic layers which are stacked on each other, the electronic component body including opposing first and second major surfaces and a side surface which connects the first and second major surfaces;

a notch extending from the first major surface to the second major surface and being formed in the side surface;

a joining electrode defined by a divided via hole conductor and located at a portion of an inside surface defining the notch;

a component mounted on the first major surface;

a cover having an opening and being arranged so as to cover the component with the opening of the cover facing the electronic component body, the cover having a leg which is positioned inside the notch, and the cover being secured to the electronic component body by joining the leg to the joining electrode; and an external terminal electrode connecting the multilayer ceramic electronic component to a wiring substrate and being disposed on the second major surface.

2. The multilayer ceramic electronic component according to claim 1, wherein the cover is made of metal, and wherein the leg and the joining electrode are joined via one of solder and an electrically conductive adhesive.

3. The multilayer ceramic electronic component according to claim 2, wherein the joining electrode is electrically connected to a ground electrode positioned inside the electronic component body.

4. The multilayer ceramic electronic component according to claim 1, wherein the electronic component body includes a plurality of side surfaces and notches are formed in each of the side surfaces.

5. The multilayer ceramic electronic component according to claim 4, wherein the cover has a plurality of legs which are fitted within the plurality of notches.

6. An electronic component aggregate having a structure including a plurality of ceramic layers which are stacked on each other, the electronic component aggregate comprising:

opposing first and second major surfaces;

wherein a plurality of the electronic component bodies of a plurality of the multilayer ceramic electronic components according to claim 1 can be obtained from the electronic component aggregate by dividing the electronic component aggregate in a direction that is substantially perpendicular to the first and second major surfaces along a division line;

wherein a plurality of the joining via hole conductors are provided so as to be located on both sides of the division line; and wherein through holes passing through the first and second major surfaces are arranged so as to divide the joining via hole conductors, and a plurality of the joining electrodes are defined by portions of the joining via hole conductors divided by the through holes.

7. The electronic component aggregate according to claim 6, wherein the plurality of joining via hole conductors and the through holes have substantially rectangular configurations.

8. The electronic component aggregate according to claim 6, wherein the plurality of joining via hole conductors have substantially rectangular configurations and the through holes have substantially circular configurations.

9. The electronic component aggregate according to claim 6, wherein the plurality of joining via hole conductors have substantially circular configurations and the through holes have substantially rectangular configurations.

* * * * *